US010290593B2

(12) United States Patent
Bai et al.

(10) Patent No.: US 10,290,593 B2
(45) Date of Patent: May 14, 2019

(54) METHOD OF ASSEMBLING QFP TYPE SEMICONDUCTOR DEVICE

(71) Applicant: NXP USA, INC., Austin, TX (US)

(72) Inventors: Zhigang Bai, Tianjin (CN); Zhijie Wang, Tianjin (CN); Jinzhong Yao, Tianjin (CN)

(73) Assignee: NXP USA, INC., Austin, TX (US)

( * ) Notice: Subject to any disclaimer, the term of this patent is extended or adjusted under 35 U.S.C. 154(b) by 21 days.

(21) Appl. No.: 15/702,768

(22) Filed: Sep. 13, 2017

(65) Prior Publication Data

US 2019/0074254 A1 Mar. 7, 2019

(30) Foreign Application Priority Data

Sep. 4, 2017 (CN) .......................... 2017 1 0783412

(51) Int. Cl.

*H01L 21/48* (2006.01)
*H01L 21/56* (2006.01)
*H01L 23/00* (2006.01)
*H01L 23/31* (2006.01)
*H01L 23/495* (2006.01)

(52) U.S. Cl.

CPC ........ *H01L 23/562* (2013.01); *H01L 21/4825* (2013.01); *H01L 21/4839* (2013.01); *H01L 21/4842* (2013.01); *H01L 21/565* (2013.01); *H01L 23/3114* (2013.01); *H01L 23/4952* (2013.01); *H01L 23/49558* (2013.01)

(58) Field of Classification Search

CPC . H01L 2224/48247; H01L 2224/73265; H01L 2224/97; H01L 2224/2919; H01L 2924/181; H01L 23/3107; H01L 21/565

See application file for complete search history.

(56) References Cited

U.S. PATENT DOCUMENTS 5,213,748 A 5/1993 Biswas et al.
5,343,076 A * 8/1994 Katayama ............. H01L 23/057 257/690
5,869,883 A * 2/1999 Mehringer ............ H01L 21/565 257/667
6,146,924 A * 11/2000 Chang ................... H01L 21/565 257/E21.504
6,384,472 B1 * 5/2002 Huang .................... H01L 21/50 257/676
7,830,667 B2 11/2010 Kurihara
8,642,396 B2 2/2014 Goh et al.

(Continued)

*Primary Examiner* — Zandra V Smith
*Assistant Examiner* — John M Parker
(74) *Attorney, Agent, or Firm* — Charles E. Bergere

(57) ABSTRACT

A method of assembling QFP devices includes providing a lead frame having leads that extend from a dam bar to a die flag, and performing a first molding process that fills spaces between the leads and between the dam bar and the die flag with a first mold compound. The first mold compound also forms a ring around the die flag, where the ring extends from both lateral sides of the lead frame. A first area around the die flag is removed to separate the leads from the die flag, and a second area near an inner corner of the dam bar is removed to form a mold gate. A die is attached to the die flag and electrically connected to the leads with bond wires, and then a second molding process is performed to encapsulate the die, bond wires and inner leads.

8 Claims, 8 Drawing Sheets

(56) References Cited

U.S. PATENT DOCUMENTS

2005/0133878 A1* 6/2005 Huang .............. H01L 27/14618
257/433
2005/0269587 A1* 12/2005 Loh ........................ H01L 33/486
257/99
2006/0038202 A1* 2/2006 Lange ................. H01L 23/4334
257/222
2008/0174981 A1 7/2008 Chan et al.
2013/0126988 A1* 5/2013 Lo ........................... H01L 24/97
257/415
2015/0179553 A1* 6/2015 Khor ....................... H01L 24/97
257/676

* cited by examiner

METHOD OF ASSEMBLING QFP TYPE SEMICONDUCTOR DEVICE

BACKGROUND OF THE INVENTION

The present invention relates to the packaging of integrated circuits (ICs) and more particularly to a method of assembling a Quad Flat Package (QFP) type device.

A QFP is a surface mounted IC package with leads that extend from its four sides. The leads often are shaped or bent into a "gull wing" form. QFP is a mature technology, having been in use since the 1970's, and therefore has the advantages of mature infrastructure of manufacturing tools and materials, as well as lower cost, compared to BGA packages, in the lead count ranging from 48 to 208 IOs. QFPs are formed using a lead frame, and it is expected that the same lead frame can be used to package chips with different die sizes. However, different die sizes means different loop lengths for the bond wires that electrically connect the die or chip to the leads of the lead frame. For example, when the die size is small and the wire pitch is fine, the wire loop length must be extended, which can cause wire sweep during encapsulation, where the longer wire loop cannot withstand the transfer pressure of the liquid mold compound.

One solution to address the longer wire length issue is to increase the inner lead length. However, for cost savings, lead frames have been becoming thinner, such as from 8 mils (that is to say, 200 microns) to 5 mils (that is to say, 125 microns), so longer leads made using thinner metal are prone to bounce during wire bonding, which can lead to poor joint strength between the bond wire and the lead, and bring residual stress to the heel of the second bond, which risks heel break during field application.

It would be desirable to have a reliable method of assembling QFP type devices with a thin lead frame that can accommodate various size dies.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
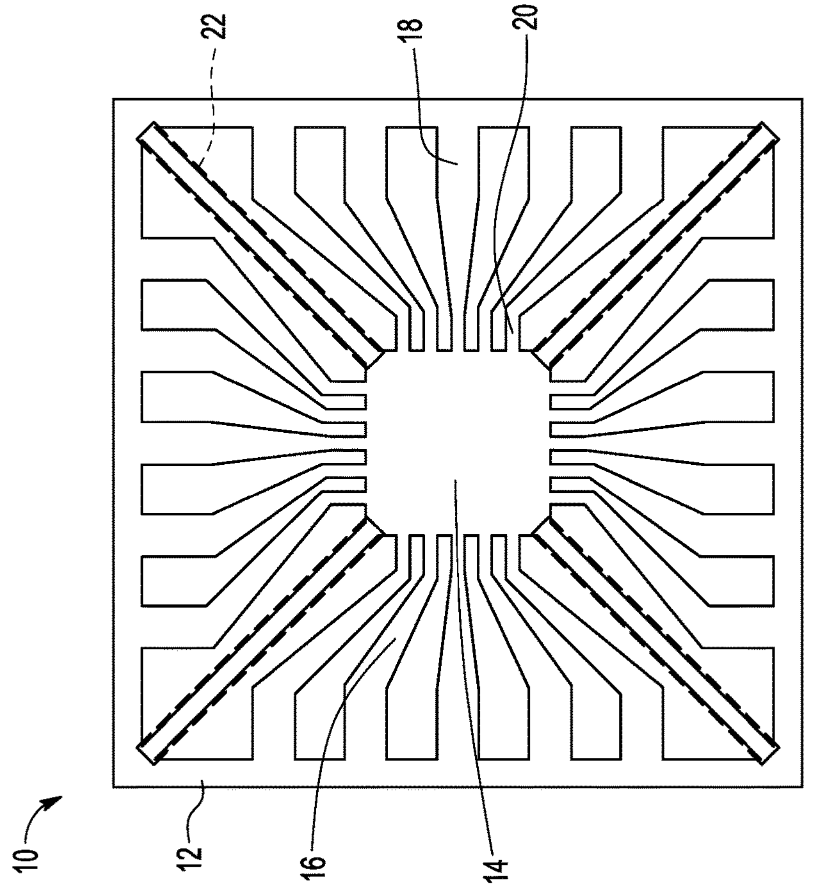
FIG. 1 is an enlarged top plan view of a lead frame in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one or more embodiments, the present invention provides a method of method of assembling a QFP type device, comprising providing a lead frame that has a dam bar, a die flag, and a plurality of leads that extend from the dam bar to a perimeter of the die flag. In one embodiment, the lead frame also has tie bars that extend from inner corners of the dam bar to outer corners of the flag. A first molding step is performed in which a first molding compound fills the spaces between the leads, and between the flag and the dam bar. The first molding compound also forms a ring spaced from and around the die pad, wherein the ring has a thickness such that it projects from both lateral sides of the lead frame. Next, a corner of the molded frame is punched to form a mold gate, and inner lead ends of the leads are separated from the die flag. A semiconductor die then is attached to the lead frame and die bonding pads are electrically connected to the inner ends of the leads proximate to the die flag. In one embodiment, the die is a flip-chip die and the electrical connections are formed by attaching the die bonding pads to the inner lead ends of the leads with solder bumps. In one or more other embodiments, the die is attached to the flag and the die bonding pads are connected to the inner lead ends of the leads with bond wires. A second molding step is performed to cover the die and electrical connections with a second molding compound, such that a housing is formed. The dam bar and outer ends of the leads that extend from the housing may be trimmed and the leads bent to any desired shape.

Referring now to FIG. 1, a top plan view of a lead frame 10 in accordance with an embodiment of the present invention is shown. The lead frame 10 is generally rectangular in shape and includes a dam bar 12, a die flag 14, and a plurality of leads fingers or leads 16. The dam bar 12 surrounds the die flag 14 and the leads 16. The leads 16 extend between the dam bar 12 and the die flag 14. The lead frame 10 preferably is formed from a copper sheet having a thickness of about 5 mils (that is to say, 125 microns), such as by punching, cutting or etching. The lead frame 10 may vary in size from about 7 mm×7 mm to about 20 mm×20 mm and the number of leads 16 can vary from about 32 to 144. The lead frame 10 also may be plated, or just certain areas of the lead frame 10 may be plated, such as the die flag 14 and/or the leads 16, with a metal or metal alloy to prevent oxidation. Plating materials such as Nickel, Gold, and Palladium are known by those of skill in the art. The leads 16 have an outer lead portion 18 that is proximate to the dam bar 12 and an inner lead portion 20 that is proximate to the die flag 14. The leads 16 may be either wider or narrower at the inner lead portions 20 than at the outer lead portions 18. In some embodiments, the lead frame 10 also includes tie bars 22 that extend from the inner corners of the dam bar 12 to the outer corners of the die flag 14, as shown. Typically, QFP lead frames have leads that are not connected to the die flag. However, in the present invention, it is preferred that the leads 16 are attached to the die flag 14 so there is a lesser chance that the leads 16 will be deformed during handling and the assembly process.

Figure 2B:
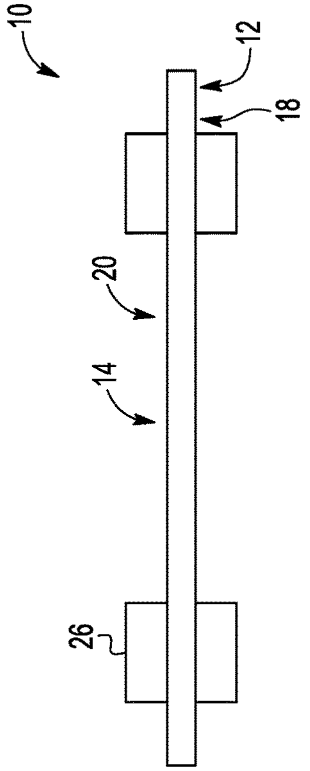
FIGS. 2A and 2B are an enlarged top plan view and an enlarged side view, respectively, of the lead frame of FIG. 1 after a first molding process.
Figure 2A:
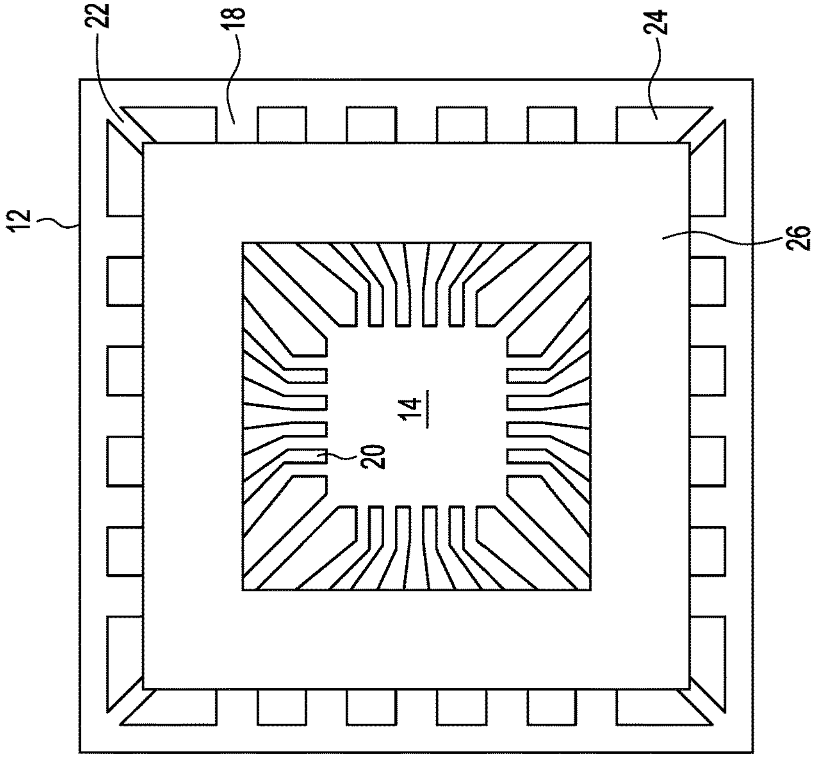

FIGS. 2A and 2B are a top plan view and a side view, respectively, of the lead frame 10 of FIG. 1 after a first molding process in which a first molding compound 24 is formed to fill the spaces between the leads 16, and between the dam bar 12 and the flag 14. The first molding compound 24 also forms a ring 26 that is spaced from and surrounds the die flag 14. That is, the mold tool is designed in a way such that there are two molded rings (in combination referred to as ring 26) surrounding the central flag as well as the inner lead ends 20 of the leads 16, one on each of top and bottom lead fame surfaces. The ring 26 has a thickness such that the ring 26 projects from both lateral sides of the lead frame 10. In one embodiment, the the mold ring 26 has a thickness of about 0.2 to 0.3 mm. In one or more other embodiments the thickness is between 0.2 mm and 0.3 mm. The mold ring 26 balances thermo-mechanical stress during the first molding step. The first molding compound 24 comprises an epoxy resin as is typically used in semiconductor packaging and known by those of skill in the art.

Figure 3:
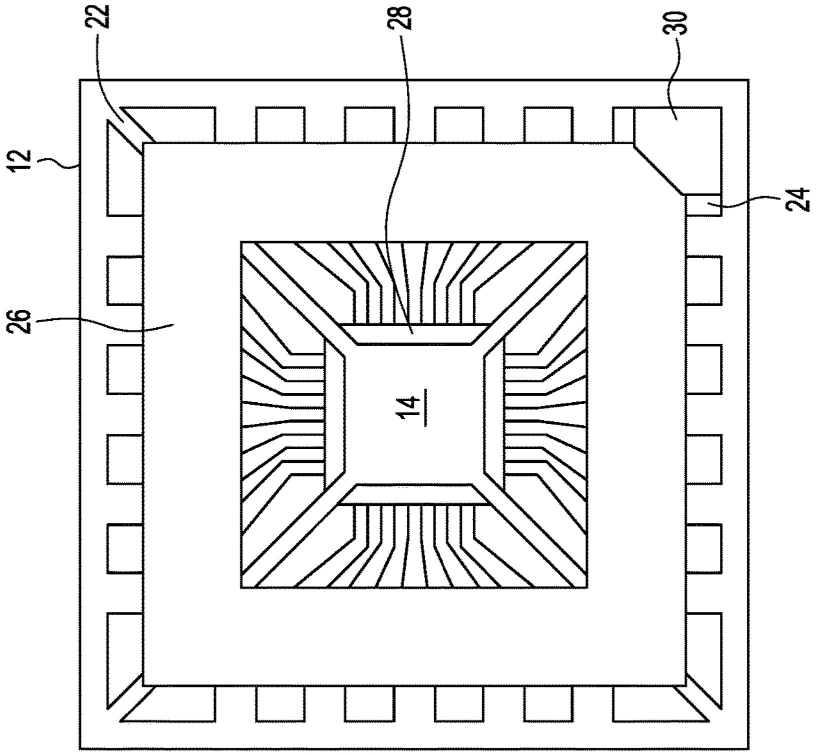
FIG. 3 is a top plan view of the molded lead frame of FIGS. 2A and 2B after removing certain portions thereof.

FIG. 3 is a top plan view of the molded lead frame of FIGS. 2A and 2B after removing certain portions thereof. More particularly, the inner lead ends 20 are separated, both physically and electrically, from the die flag 14 such as by punching, cutting or etching, as indicated by the gap 28 shown around the die flag 14. In one embodiment, the lead frame 10 includes tie bars 22, and the tie bars 22 remain connected to the die flag 14 to provide stability thereto. In other embodiments, the tie bars 22 may be used to provide power (or ground), in which case, like the leads 16, the tie bars 22 are separated from the die flag 14. In the presently preferred embodiment, one of the inner corners of the molded lead frame assembly proximate to the dam bar 12 also is removed such as by punching or etching to form a mold gate insert area 30, as will be described in more detail below.

Figure 4B:
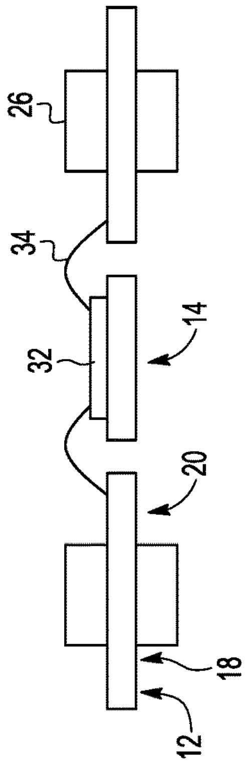
FIGS. 4A and 4B are a top plan view and a side view, respectively, of the assembly of FIGS. 3A and 3B after a wire bonding step.
Figure 4A:
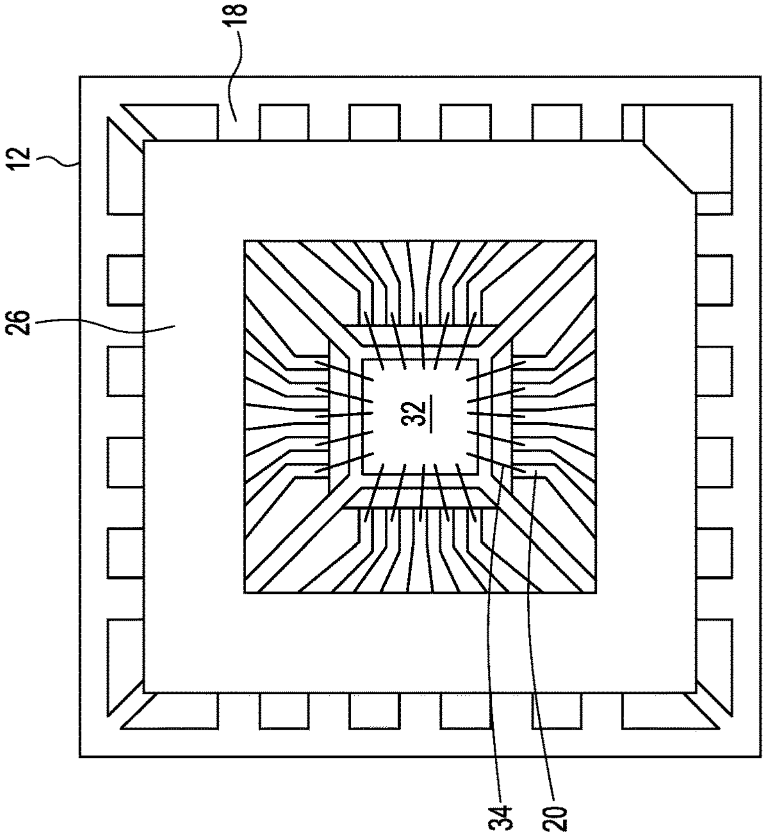

FIGS. 4A and 4B are a top plan view and a side view, respectively, of the assembly of FIGS. 3A and 3B after die attach and wire bonding. A bottom surface of a semiconductor die 32 is attached to the die flag 14, such as with an epoxy adhesive or an adhesive tape. In the embodiment shown, the die 32 has die bonding pads on a top surface thereof that allow for electrical connection to the die circuitry. The die 32 is electrically connected to the inner lead ends 20 of the leads 16 using bond wires 34.

Since the leads 16 extend from the dam bar 12 towards the die flag 14, the wires 34 need not be unduly long to extend from the die 32 to the inner lead ends 20. Further, the ring 26 provides mechanical support so that a reliable stitch bond can be made. The die 32 may be any kind of die, such as a microprocessor, a DSP, a special function circuit, etc., and the invention is not to be limited by the type of die. The die 32 also is not limited to a particular technology such as CMOS, or derived from any particular wafer technology. Further, the die 32 may vary in size, as long as it fits on the die flag 14.

Figure 5B:
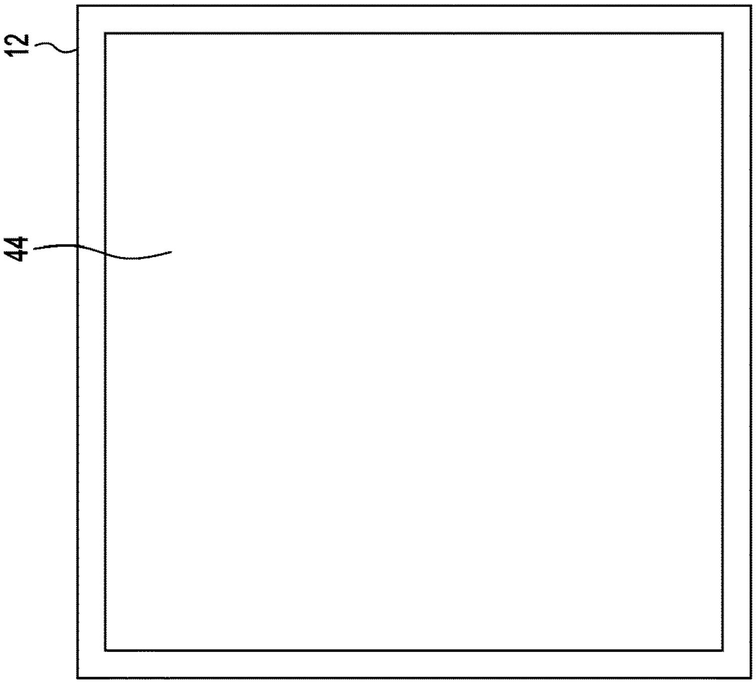
FIG. 5A illustrates a second molding process being performed on the assembly of FIGS. 4A and 4B and FIGS. 5B and 5C are a top plan view and a side view, respectively, of the assembly of FIGS. 4A and 4B after the second molding process.
Figure 5A:
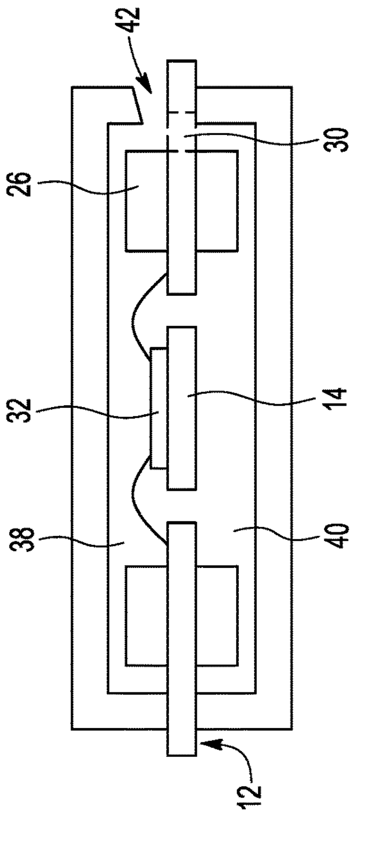

FIG. 5A illustrates a second molding process being performed on the assembly of FIGS. 4A and 4B. The assembly including the lead frame 10, die 32, and bond wires 34 is inserted into a mold 36 such that there are top and bottom cavities 38, 40 around the assembly, and a mold gate 42 that mates with the mold gate insert 30 formed in the corner of the assembly. A second molding compound 44 (shown in FIGS. 5B and 5C) is then injected into the top and bottom cavities 38, 40 by way of the mold gate 42.

Figure 5C:
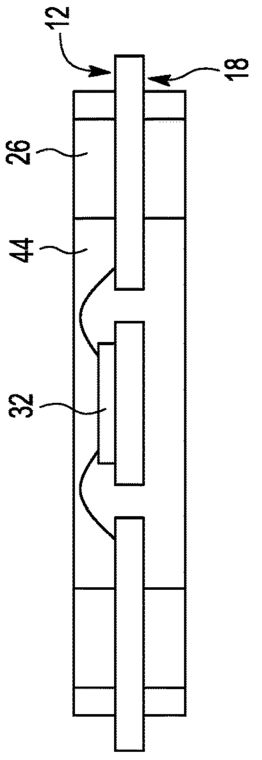

FIGS. 5B and 5C are a top plan view and a side view, respectively, of the assembly of FIGS. 4A and 4B after the second molding process. The second mold compound 44 covers the the die 32, bond wires 34, the first mold compound 24, including the ring 26, such that a housing is formed therearound. The dam bar 12 and outer end portions 18 of the leads 16 extend beyond and project from the housing. The mold ring 26 forms a locking feature during the second molding process by increasing a contact area between the first and second mold compounds 24, 44, and reducing a contact area between the second mold compound 44 and exposed portions of the lead frame 10. In the presently preferred embodiment, the first and second mold compounds 24 and 44 comprise the same material; that is, they comprise the same epoxy-resin so there is no material mismatch.

After removing the now encapsulated assembly from the mold 36, the dam bar 12 is cut off and the outer lead ends that extend or project from the housing may be bent or shaped, such as into a gull wing. It is understood that some of the molding compound 44 also may be trimmed or cut off in order to ensure the outer lead ends 18 are adequately exposed.

Figure 6A:
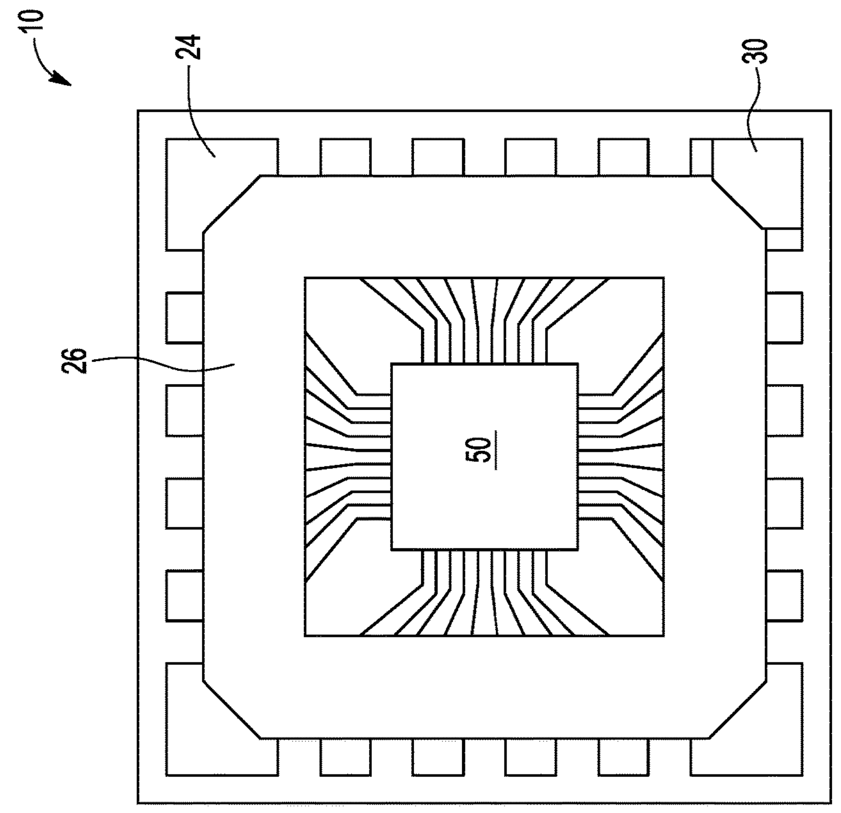
FIG. 6A is an enlarged top plan view of the assembly shown in FIGS. 2A and 2B after alternative portions of the assembly have been removed.

The present invention also provides a method of assembling a QFP device where a flip-chip die is used, instead of the wire-bond die 32. FIG. 6A is a top plan view of the assembly shown in FIGS. 2A and 2B after alternative portions of the assembly have been removed. More particularly, the lead frame 10 is covered with the first mold compound 24, and then the lead frame flag 14 is cut out or removed to form a gap 50. One of the inner corners also is cut out to form the mold gate insert area 30 as discussed above.

Figure 6C:
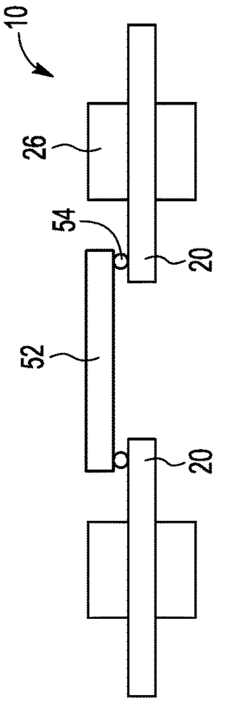
FIGS. 6B and 6C are an enlarged top plan view and an enlarged side view of the assembly of FIG. 6A after attaching a flip-chip die thereto.
Figure 6D:
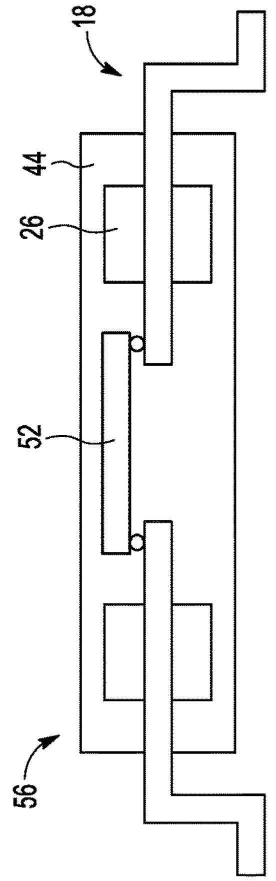
FIG. 6D is an enlarged cross-sectional side view illustrating the assembly of FIGS. 6B and 6C after a second molding process.
Figure 6B:
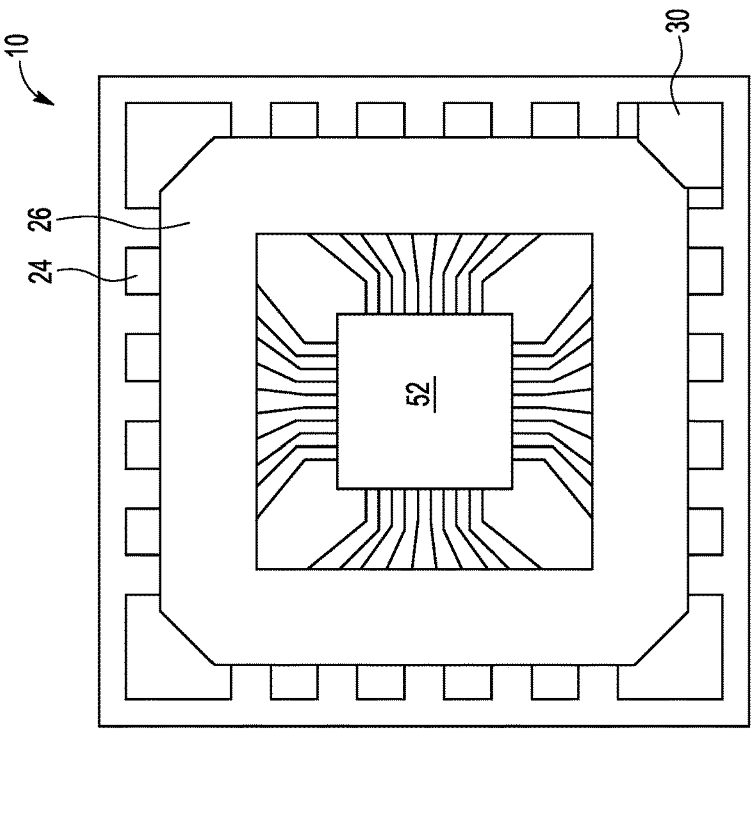

FIGS. 6B and 6C are a top plan view and a side view of the assembly of FIG. 6A after attaching a flip-chip die 52 thereto. More particularly, the die 52 is mounted on the inner lead ends 20 of the leads 16, with the die bonding pads making electrical connection to the inner lead ends 20 such as with conductive balls 54. The conductive balls 54 allow electrical interconnection to the die 52. In one embodiment, the conductive balls 54 comprise C4 solder balls. This assembly is then covered with the second molding compound 44 such that a housing is formed with the outer lead ends 18 projecting therefrom. FIG. 6D is a cross-sectional side view illustrating a QFP type device 56 assembled using the flip-chip die 52 and having outer lead ends 18 shaped as gull wings, after the second molding process is performed.

Figure 7:
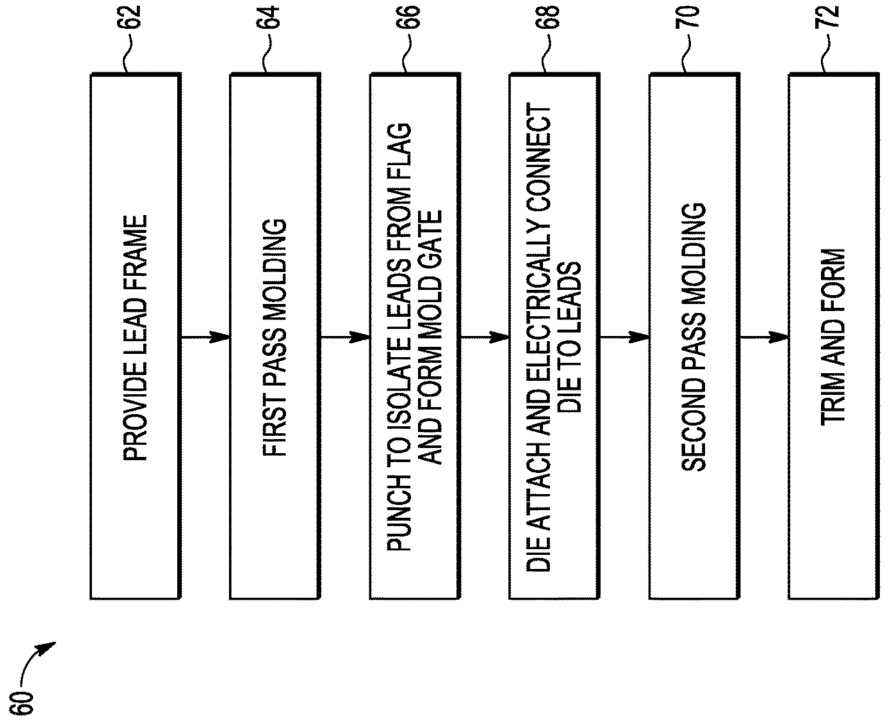
FIG. 7 is a flow chart illustrating steps in a method of assembling a QFP device in accordance with an embodiment of the present invention.

FIG. 7 is a flow chart 60 summarizing the steps in a method of assembling a QFP device in accordance with an embodiment of the present invention. The first step 62 comprises providing a lead frame such as the lead frame 10 shown in FIG. 1. The lead frame is designed such that all the IOs (leads) of the lead frame are mechanically connected to the central metal flag. In this way, the leads (which may also be referred to as lead fingers) will be less likely to be deformed during lead frame manufacturing as well as during the package assembly process. Next, a first pass molding step 64 is performed in which the space between the leads is filled with the first mold compound 24, which space is bounded by the dam bar 12 and the die flag 14. The ring 26 also is formed with the first mold compound 24. In step 66, the mechanical and electrical connection between the leads 16 and the die flag 14 is severed by separating the adjoining portion of the inner leads 20 from the die flag 14. A mold gate insert also is formed. While the mold gate insert area 30 shown in FIGS. 3 and 6A is in a corner of the lead frame, that is not a requirement as the mold gate insert may be located in other areas so long as it does not compromise any of the leads 16. The leads 16 may be separated from the die flag 14 and the mold gate insert area 30 formed by punching, cutting, or etching. In step 68, conventional die attach and conventional wire bonding are performed.

In step 70, a second pass molding step is performed. In this step, the die, bond wires, and lead frame are covered with a second mold compound. Preferably the second mold compound comprises the same material as the first mold compound, which preferably is a conventional semiconductor encapsulant. The mold ring 26 formed around the die flag 14 in the first molding pass 64 acts to fill the clearance/gap among various lead frame features such as the dam bar 12, flag 14, and leads 16, during the first molding process. The mold ring 26, which extends outwards on both lateral sides of the lead frame, is helpful to balance the thermos-mechanical stress during the first molding process 64, which allows for better manufacturability during the die bond and wire bonding processes 68. The mold ring 26 also forms a locking feature during the second molding process 70 by increasing mold compound-to-mold compound contact area and reducing second pass mold compound-to-metal lead frame contact area, thus allowing for better package anti-delamination capability. After removing the assembly from the mold, the housing and outer lead ends may be trimmed and formed, such as into gull wings, as shown in step 72.

As is evident from the foregoing discussion, the present invention provides method of assembling a QFP type device, and for a QFP type device assembled according to the method.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A QFP device, comprising:

a semiconductor die electrically connected to inner lead ends of a plurality of leads of a lead frame;

a ring formed from a first mold compound that surrounds the semiconductor die and the electrical connections of the die to the inner lead ends, wherein the ring is formed over a central portion of the leads and extends outward from top and bottom surfaces of the leads; and a second mold compound that covers and forms a housing around the leads, the semiconductor die, the electrical connections between the die and the inner lead ends, and the ring, wherein outer lead ends of the leads project outwardly from the housing, and wherein the second mold compound fully encapsulates the die and the electrical connections and is formed over both inner and outer side surfaces of the ring such that outer lateral sides of the housing comprising the second mold compound are exposed and the outer lead ends project therefrom.

2. The QFP device of claim 1, wherein the semiconductor die is mounted to a die flag of the lead frame and the electrical connections between the semiconductor die and the inner lead ends comprise bond wires.

3. The QFP device of claim 2, wherein the die is attached to the flag with one of an epoxy and an adhesive tape.

4. The QFP device of claim 1, wherein the semiconductor die comprises a flip-chip die, and the die is mounted on the inner lead ends such that die bonding pads are electrically coupled to the inner lead ends.

5. The QFP device of claim 1, wherein the outer ends of the leads that extend beyond said housing are formed into a gull wing shape.

6. The QFP device of claim 1, wherein the mold ring has a thickness of about 0.2 to 0.3 mm.

7. The QFP device of claim 1, wherein the first and second mold compounds comprise the same material.

8. The QFP device of claim 1, wherein the lead frame is formed from copper.

* * * * *